United States Patent
Marchese et al.

(10) Patent No.: US 10,416,198 B2
(45) Date of Patent: Sep. 17, 2019

(54) GAS-TIGHT COMPARTMENT AND OPTICAL VOLTAGE SENSOR WITH COATED ELECTRO-OPTIC CRYSTAL

(71) Applicant: ABB Schweiz AG, Baden (CH)

(72) Inventors: Sergio Vincenzo Marchese, Zürich (CH); Xun Gu, Neuenhof (CH); Burak Büyükkavir, Winterthur (CH); Klaus Bohnert, Oberrohrdorf (CH); Tobias Erford, Zürich (CH)

(73) Assignee: ABB Schweiz AG, Baden (CH)

( * ) Notice: Subject to any disclaimer, the term of this patent is extended or adjusted under 35 U.S.C. 154(b) by 30 days.

(21) Appl. No.: 15/708,968

(22) Filed: Sep. 19, 2017

(65) Prior Publication Data
US 2018/0080958 A1 Mar. 22, 2018

Related U.S. Application Data

(63) Continuation of application No. PCT/EP2015/055792, filed on Mar. 19, 2015.

(51) Int. Cl.
*G01R 15/24* (2006.01)

(52) U.S. Cl.
CPC .................. *G01R 15/242* (2013.01)

(58) Field of Classification Search
CPC .. G01R 15/242; G01R 15/247; G01R 15/245; G01R 19/0046; G01R 19/155; G01R 31/3274; G02F 1/1339; G02F 1/011; G02F 1/095; G02F 1/13624; G02F 1/2255; G02F 2001/212; G02F 2203/21; G02F 2203/60; G02B 27/0172; G02B 5/30; G02B 6/02; G02B 6/08; G02B 6/122; G02B 7/1815; G01N 15/1434; G01N 21/645; G01N 21/7746; H01S 3/0057; H01S 3/06725;
(Continued)

(56) References Cited

U.S. PATENT DOCUMENTS 4,866,372 A * 9/1989 Aoshima ................ G01R 1/071
324/96
5,136,236 A 8/1992 Bohnert et al.
5,247,244 A 9/1993 Miller et al.
(Continued)

FOREIGN PATENT DOCUMENTS

DE 19604908 A1 8/1997
EP 0907084 A2 4/1999
(Continued)

OTHER PUBLICATIONS

International Search Report, PCT/EP2015/055792, ABB Technology AG, dated Nov. 6, 2015, 3 pages.
(Continued)

*Primary Examiner* — Vinh P Nguyen
(74) *Attorney, Agent, or Firm* — Taft Stettinius & Hollister; J. Bruce Schelkopf

(57) ABSTRACT

The invention relates to an assembly of a gas-tight compartment and an optical voltage sensor that further comprises a module. The module comprises an electro-optic crystal and electrodes, wherein the electro-optic crystal is the only element of the module to mechanically connect the two electrodes and to bridge the potentials of the two electrodes. The assembly is particuarly suited to measure direct current voltages.

28 Claims, 2 Drawing Sheets

Figure 1A:
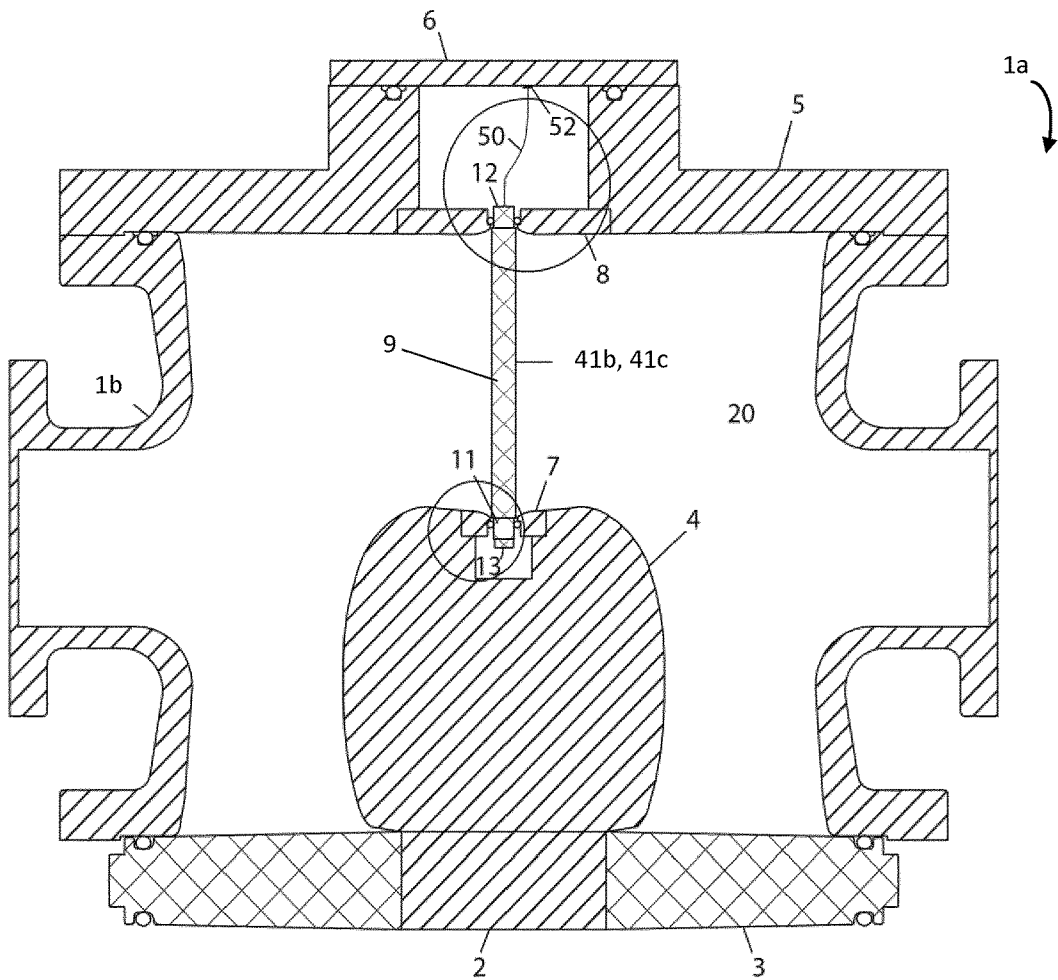

(58) Field of Classification Search
CPC .... H01S 3/06791; H01S 3/0811; H01S 3/168; H01S 3/213; H02G 5/066
See application file for complete search history.

(56) References Cited

U.S. PATENT DOCUMENTS

| | | | |
|---|---|---|---|
| 5,715,058 A | 2/1998 | Bohnert et al. | |
| 6,016,053 A | 1/2000 | Yakymyshyn et al. | |
| 7,633,285 B2* | 12/2009 | Rahmatian | H02B 13/065 324/107 |
| 8,242,402 B2* | 8/2012 | Bohnert | G01R 15/247 218/46 |
| 9,121,872 B2* | 9/2015 | Wang | G01R 19/155 |

FOREIGN PATENT DOCUMENTS

| | | |
|---|---|---|
| EP | 1462810 A1 | 9/2004 |
| EP | 1710589 A1 | 10/2006 |
| JP | 3099669 B2 | 10/2000 |
| WO | 0034793 A1 | 7/2008 |
| WO | 2008077255 A1 | 7/2008 |
| WO | 2009080109 A1 | 7/2009 |
| WO | 2011154408 A1 | 12/2011 |

OTHER PUBLICATIONS

International Preliminary Report on Patentability, PCT/EP2015/055792, ABB Schweiz AG, dated Feb. 15, 2017, 13 pages.

Kurosawa, et al., Development of an optical instrument transformer for DC voltage measurement, IEEE Transactions on Power Delivery, vol. 8, pp. 1721-1726, 1993.

Cecelja, et al., Validation of electro-optic sensors for measurement of DC fields in the present of space charge, Measurement, vol. 40, pp. 450-458, 2007.

Chavez, et al., IEEE Transactions on Power Delivery 17, 362 (2002).

* cited by examiner

GAS-TIGHT COMPARTMENT AND OPTICAL VOLTAGE SENSOR WITH COATED ELECTRO-OPTIC CRYSTAL

TECHNICAL FIELD

The invention resides in the field of optical voltage sensing and specifically relates to an assembly comprising an optical voltage sensor and a gas-tight compartment and to a gas-insulated switchgear comprising such an assembly according to the independent claims.

BACKGROUND OF THE INVENTION

In prior art, there are several embodiments of optical voltage sensors integrated into gas-insulated switchgear: U.S. Pat. No. 6,016,053 [1] discloses a voltage transformer formed by an optical voltage sensor incorporated into gas-insulated switchgear, wherein the voltage sensor comprises a Pockels crystal, such as a BGO crystal, with two parallel surfaces, that are perpendicular to the electric field lines and are coated with a transparent, electrically conductive layer. The crystal is rigidly fixated within an insulating tube and with flanges at both ends that form a low-voltage and a high-voltage end of the transformer. The voltage transformer is rigidly fixated by a carrying arm within the switchgear at the low-voltage end; at the high-voltage end, the voltage transformer is supported in a shielding cover by rubber elastic foam rings and a bearing ring as well as a contact spring. The voltage transformer further comprises a gas/molecular filter to remove reactive decomposition products of the insulation gas and moisture from the gas compartment.

DE 196 04 908 A1 [2] discloses a voltage measurement device incorporated into gas-insulated switchgear. The device comprises a cylinder-shaped quartz crystal between high voltage and ground potential. An optical fiber is wrapped onto the cylinder surface. The periodic piezoelectric deformation of the crystal as a result of an applied alternating current (AC) voltage produces a differential optical phase shift of light waves propagating in the fiber which serves as a measure for the voltage. The quartz crystal is equipped with metallic fittings at both ends. The fittings are in electric contact with field steering electrodes by means of contact springs. Vibration damping material between the fittings and electrodes protects the crystal against mechanical vibrations and shock. An insulating pipe between high voltage and ground electrodes encloses the crystal. The hollow volume inside the pipe is in gas exchange with the switchgear gas volume via a cartridge. The cartridge contains an absorber material that prevents reactive decomposition products of the insulation gas produced by electric arcing from reaching the crystal.

WO 2009/080109 A1 [3] discloses an optical voltage sensor incorporated into gas-insulated switchgear. An electro-optic rod or fiber resides within a bore of a partition insulator which extends radially from the bus bar on high voltage to the metal enclosure on ground potential. The bore is filled with oil or resin. The electro-optic fiber or rod may be inserted, in addition, into an oil-filled capillary.

U.S. Pat. No. 5,136,236 [4] and EP 1 710 589 (A1) [5] describe further embodiments of optical voltage sensors incorporated into gas-insulated switchgear, wherein the voltage measurement is reduced to a measurement of local electrical field.

K. Kurosawa et al., "Development of an optical instrument transformer for DC voltage measurement," IEEE Transactions on Power Delivery, vol. 8, pp. 1721-1726, 1993 [6] and F. Cecelja, et al., "Validation of electro-optic sensors for measurement of DC fields in the presence of space charge,"Measurement, vol. 40, pp. 450-458, 2007 [7] disclose optical voltage sensors for direct current (DC) voltage. Both embodiments employ an electro-optic crystal that exhibits linear birefringence in the presence of electrical fields transverse to the direction of light propagation.

U.S. Pat. No. 5,715,058 [8] lists different electro-optic crystal classes and crystal orientations together with corresponding materials that enable line integration of the electrical field without exhibiting birefringence at zero electrical field. In addition, a sensor configuration is disclosed with the electro-optic crystal attached between two glass plates that act as holding elements and as substrates for the layer electrodes formed by a transparent or reflective electrically conducting film.

In the context of optical voltage sensors for alternating current (AC) voltages, field steering and shielding of unwanted stray fields have been considered:

WO 00/34793 [9] and Chavez et al., IEEE Transactions on Power Delivery 17, 362 (2002) [10], disclose optical voltage sensors comprising one or more local electrical field sensor(s) distributed along a path from ground to high voltage inside an insulating tube or section; insensitivity to electrical stray fields is achieved by a specified permittivity and geometry of the insulating section.

WO 2011/154408 A1 [11] discloses an optical high voltage sensor for outdoor use comprising a cylinder-shaped electro-optic or piezo-electric crystal in the longitudinal bore of an epoxy insulator pole. The insulator pole contains two sets of embedded electrode foils in a concentric and staggered arrangement in order to achieve an advantageous electric field distribution. The remaining hollow volume of the bore is filled with filler material. In a preferred embodiment, an electro-optical crystal is equipped with electrically conducting electrodes to control the field distribution near the crystal ends. The electrodes are attached to the sensor crystal in a flexible manner, i.e. by means of rubber o-rings or silicone. Alternatively, the contacting electrodes can be made from electrically conducting rubber or elastomers. The electrodes are in electric contact with the ground and high voltage potentials by electric wires. Also, the crystal facets may be coated with optically transparent conductive films which are again electrically contacted by wires. This design is disadvantageous for measurement of DC voltages as space charges may accumulate in the insulating material with increased risk of dielectric breakdown.

Schemes for interrogation of the electro-optic phase shift induced by the electro-optic effect or Pockels effect in an electro-optic crystal are e.g. disclosed in [1], [2], [11], and WO 2008/077255 A1 [12]. These embodiments comprise interrogation schemes with the electro-optic crystal integrated into the optical path of the interrogation system in transmission or in reflection as well as polarimetric schemes, wherein the phase shift is converted into a change of light powers by means of passive optical elements such as retarders and polarizers, and interferometric schemes, wherein the phase shift is modulated by an optic modulator.

Further Embodiments of Optical Voltage Sensors:

EP 1 462 810 A1 [13] discloses an optical voltage sensor, wherein the sensing element is formed as a stack of alternating layers of quartz glass and electro-optic crystals. The contact electrodes are attached to both ends of this stack so that voltage to be measured drops over the entire stack.

EP 0 907 084 B1 [14] discloses an optical voltage sensor consisting of a series of cylinder-shaped piezo-electric quartz sensing elements with an attached optical fiber, separated by metal tubes, and arranged in a hollow-core high voltage insulator. The ends of each quartz element are equipped with an inner electrode of appropriate thermal expansion attached to the crystal by an electrically conducting glue, a field steering outer electrode, and an intermediate metal plate. The sensing element with the attached electrodes is flexibly connected to the neighboring metal tubes by spring elements. The whole assembly is embedded into polyurethane foam.

Designs of prior art for integration of voltage sensors in gas-insulated switchgear, e.g. [1], [2], and [3], have in common that the voltage sensing element resides in a tube-shaped insulator which is disadvantageous for direct current (DC) voltage sensing, as space charges can accumulate in that insulator and thus can impact the dielectric strength of the arrangement. Further embodiments of prior art [4], [5] rely only on local magnetic field measurement and are hence prone to influences from stray fields, e.g. stemming from space charges, so that they are, in particular, is advantageous for measurement of DC voltages. Voltage sensors of prior art especially designed for measurement of DC voltages [6], [7] show, due to a crystal geometry with the voltage applied transverse to the optical path, a sensitivity to space charge effects within the crystal, which is as well disadvantageous for DC voltage measurement, as it results in signal drifts over time.

BRIEF SUMMARY OF THE INVENTION

It is an objective of the invention to provide an assembly comprising a gas-tight compartment and an optical voltage sensor, with the optical voltage sensor comprising a module that can be mounted in the gas-tight compartment. The assembly is especially suited for measurements of direct current (DC) voltages, because the optical voltage sensor with the module mounted in the gas-tight compartment exhibits advantageous performance inter alia due to an optimized electrical field distribution in the gas-tight compartment, due to minimized build-up of space charges, due to insensitivity to time-dependent residual space charges, and furthermore due to an elastic fixation of elements within the module.

A first aspect of the invention consists in an assembly comprising an optical voltage sensor and a gas-tight compartment, the optical voltage sensor comprising a module,
  with the module comprising first and second electrodes, for applying a potential difference defining the voltage to be measured, and an electro-optic crystal having a first facet electrically connected to the first electrode and a second facet electrically connected to the second electrode,
  with the gas-tight compartment and the module designed so that the module can be mounted or is mountable in the gas-tight compartment,
characterized in that the electro-optic crystal is the only element of the module that mechanically connects the two electrodes, or in other words bridges, dielectrically bridges or dielectrically separates the potentials of the two electrodes. In particular, the module does not comprise an insulating tube or an insulator with a bore, the tube or insulator surrounding the electro-optic crystal at least partially along its length or in its full length. Furthermore, in preferred embodiments, the gas-tight compartment does not comprise an insulating tube or an insulator with a bore, bridging the potentials of the two electrodes (7, 8) and surrounding the electro-optic crystal (9) in its full length, when the module is mounted in the gas-tight compartment (1a) and a potential difference is applied to the electrodes (7, 8). The disclosed design hinders the buildup of space charges in elements of the module in vicinity to the electro-optic crystal.

In a preferred embodiment, the gas-tight compartment comprises a first outer electrode, shaped to fit the first electrode of the module, and a second outer electrode, shaped to fit the second electrode of the module, in particular wherein at least one electrode of the module is connectable to the corresponding outer electrode by a mechanical, reversible fastening device. Preferably, the first outer electrode is electrically connected to a conductor guided into the gas-tight compartment through an insulating wall and the second outer electrode is electrically connected with electrically conducting walls of the gas-tight compartment.

It is further preferred that any elements, insulating elements, or walls of the gas-tight compartment bridging the potential of the electrodes are in a distance, in particular a lateral distance, to the electro-optic crystal exceeding the length of the electro-optic crystal, when the module is mounted in the gas-compartment and a potential difference is applied to the electrodes.

In addition, it is preferred that the module has a longitudinal axis and that a lateral extension of each electrode of the module exceeds the extension of the corresponding facet at least by a factor of two.

In embodiments, at least parts of the gas-tight compartment are exposed at its outside to ambient air.

In another embodiment, probe light propagates along a light path at least once through the electro-optic crystal from one facet to the other facet, and the crystal class of the electro-optic crystal and its crystal orientation with respect to the light path are chosen so that an electro-optic phase shift is proportional to a line integral of the electric field along the light path through the electro-optic crystal. This embodiment is preferred since it ensures that changes in the electric field distribution due to space charges and field-induced currents inside the crystal do not affect the measurement.

In a further preferred embodiment, first and second facet of the electro-optic crystal are coated, partially or completely, with electrically conductive layers that are transparent at both facets, or are transparent at one facet and reflective at the other facet. Preferably, surface parts of the electro-optic crystal exposed to a potential drop, when the module is mounted in the gas-tight compartment and a voltage is applied, are coated partially or completely with a layer having a moderate electrical conductivity, which is larger than the conductivity of the electro-optic crystal and is smaller than the conductivity of the electrically conductive layers at the first and second facet.

In further preferred embodiments, at least one base element is attached to at least one of the facets. Preferably, herein at least one of the at least one base element is transparent. The at least one of the at least one base element is preferred to be of a material of lower elasto-optic coefficient than the electro-optic crystal and is preferred to be of BK7 glass, flint glass, or fused silica. It is further preferred that the at least one base element has a higher fracture toughness than the electro-optic crystal and/or has a thermal expansion coefficient within a percentage range of [50%, 200%] or [20%, 500%] of the thermal expansion coefficient of the electro-optic crystal. In another preferred embodiment, at least one optical arrangement is attached to the at least one base element, the optical arrangement comprising at least one optical element selected from the group consisting of: a Faraday rotator, a collimating lens, a graded index lens, a phase retarder, a mirror, a retroreflector, a beamsplitter, a polarizer, a polarizing beam splitter, an optical fiber, or combinations thereof. It is further preferred that at least one of the at least one base element has surfaces that are partially or completely coated with conductive layers that are in electrical contact with the corresponding facet. Furthermore, embodiments are preferred with an elastic fixation between the at least one base element and the electrode that is electrically connected with the corresponding facet, with the elastic fixation comprising at least one element selected from the group consisting of: o-ring, conductive o-ring, elastic adhesive, conductive elastic adhesive, silicone adhesive, mechanical spring, and combinations thereof. Preferably, a contact area between the electro-optic crystal and the at least one base element is smaller than the area of the corresponding facet of the electro-optic crystal. It is preferred that an electrically conductive path is formed between at least one of the electrodes and the corresponding first or second facet via a conductive wire, conductive adhesive, or a conductive o-ring connecting the at least one electrode with a base element that is in electrical contact with the corresponding facet, wherein the conductive wire, the conductive adhesive, or the conductive o-ring reside(s) on the field-averted side of the electrode, when the module is mounted within the gas-tight compartment and a potential difference is applied to the electrodes.

In a further preferred embodiment, the assembly is for measuring an element of the group consisting of: a direct current (DC) voltage, a high direct current (DC) voltage, an alternating current (AC) voltage, a high alternating current (AC) voltage, voltages larger than 50 kV, or combinations thereof.

In another preferred embodiment, the assembly is part of a gas-insulated switchgear, or is attachable to a gas-insulated switchgear, in particular the assembly has means for attaching it to a gas-insulated switchgear.

In further preferred embodiments, the gas-tight compartment is filled with gas, an insulation gas, a dielectric insulation medium, $SF_6$, $N_2$, $CO_2$, or a gas mixture. Especially, surface parts or such surface parts of the electro-optic crystal that are exposed to a potential drop, when the module is mounted in the gas-tight compartment and a potential difference is applied to electrodes, are in direct contact with the medium or gas inside the gas-tight compartment. In addition, it is preferred that the surface of the electro-optic crystal is partially or completely coated with a layer passivating the electro-optic crystal.

In another preferred embodiment, the gas-tight compartment is evacuated.

Second and third aspects of the invention consist in a gas-insulated switchgear and direct current gas-insulated switchgear comprising the disclosed assembly.

SHORT DESCRIPTION OF THE FIGURES

Figure 1B:
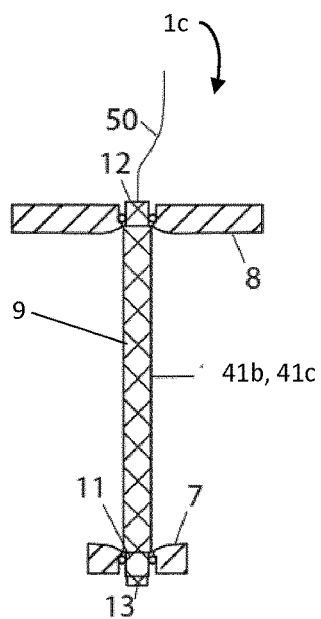
Figure 2:
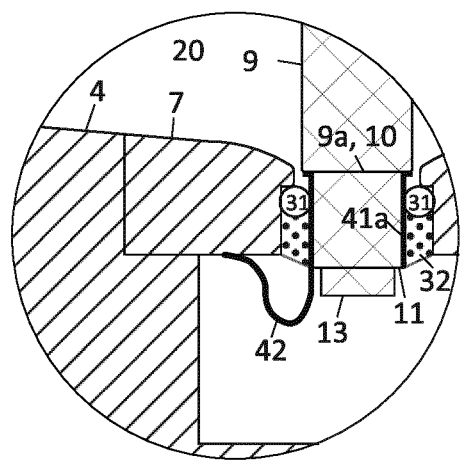
Figure 3:
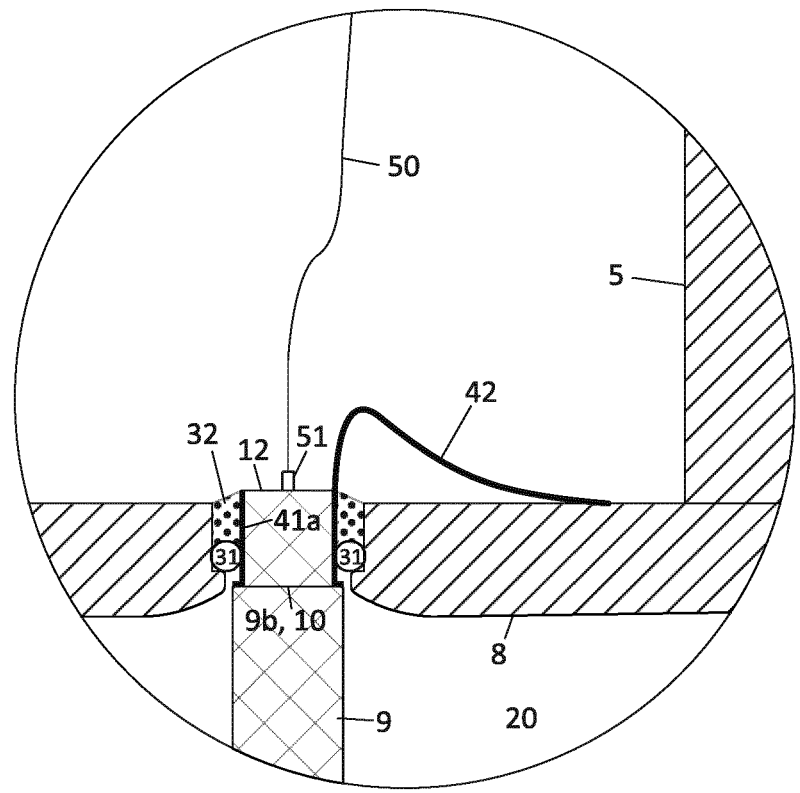

FIG. 1a shows an assembly according to a preferred embodiment of the first aspect of the invention.
FIG. 1b shows a module of the assembly of FIG. 1a.
FIG. 2 shows a blow-up of FIG. 1a.
FIG. 3 shows another blow-up of FIG. 1a.

DETAILED DESCRIPTION OF THE INVENTION

FIG. 1a shows a preferred embodiment of the disclosed invention with a module 1c of the optical voltage sensor mounted in the gas-tight compartment 1a in a cross-section view. The gas-tight compartment 1a is formed by metallic walls 1b, a metallic annular flange 5, and a round top flange 6 being on ground potential as well as an insulating wall 3 with a feed-through of a dead-end conductor 2 which leads the voltage to be measured into the compartment. Rubber-elastic o-rings between the individual wall sections ensure a gas-tight sealing of the compartment. A shielding over, comprising a tulip-shaped retainer 4 and being connected to the dead-end conductor, represents an outer high voltage electrode, into which the high voltage electrode 7 of the module 1c is inserted. The ground electrode 8 of the module 1c is held and electrically contacted by the annular flange 5. One or more optical fibers 50 are guided into the gas-tight compartment 1a to the ground-potential end of the module 1c through a gas-tight fiber-feedthrough 52 in the round top flange 6.

The electro-optic crystal 9, preferably formed as a cylinder and preferably of round base, is attached via a transparent base element 11 at the high-voltage end and another transparent base element 12 at the other end to the corresponding electrodes 7 and 8. The base elements are preferably glued to the crystal, in particular by an optical adhesive. At high-voltage end, the transparent base element 11 is terminated on its face opposite to the electro-optic crystal by a reflector 13. The transparent base elements 11, 12 can be made e.g. from BK7 glass, fused silica, or flint glass. The electrodes 7, 8 of the module 1c are made from an electrically conductive material, such as e.g. metal or electrically conductive rubber.

FIG. 1b shows the module 1c separated from the gas-tight compartment 1a. The two electrodes 7, 8 are mechanically connected only by the electro-optic crystal 9 and, accordingly, the electro-optic crystal 9 is the only element of the module 1c that mechanically connects the two electrodes 7, 8 and bridges or dielectrically bridges any electrical potentials applicable between the two electrodes 7, 8. The module 1c has a longitudinal axis, and the lateral extension of each electrode 7, 8 of the module 1c exceeds the extension of the corresponding facet 9a, 9b, e.g. at least by a factor of two, so that the module 1c is of practicable size for mounting.

FIG. 2 shows a blow-up of FIG. 1a at the high-voltage end of the sensor head module. FIG. 3 shows a blow-up at the ground potential end. The electro-optic crystal 9 has a first facet 9a, which is electrically connected to the high-voltage electrode 7, and a second facet 9b, which is electrically connected to the electrode at ground potential 8. The facets 9a, 9b are preferably coated by a transparent conductive layer 10, e.g. of aluminum-doped zinc oxide, to establish a defined potential at the crystal facets 9a, 9b.

The contact areas of the base elements 11, 12 with the corresponding facets 9a, 9b of the electro-optic crystal 9 are smaller than the corresponding facets 9a, 9b. Herein, the area of the facets 9a, 9b surpassing the contact area with the base elements may serve to provide an electric connection between the electrodes 7, 8 and the facets 9a, 9b, respectively. In embodiments, the volume enclosed by the surpassing area, the base elements 11, 12, and the electrodes 7, 8 can house means for fixation between the base elements 11, 12 and the electrodes 7, 8. At both ends, the base elements 11, 12 are preferably fixated via an o-ring 31 and an elastic adhesive 32 to the electrodes 7, 8. The sides of the transparent base elements 11, 12, not passed by probe light, are coated by a conductive layer 41a that is in electrical contact with the conductive layers 10 on the crystal facets 9a, 9b, e.g. by extending the conductive layer 41a onto the area of the facets 9a, 9b surpassing the contact area with the base elements 11, 12. At both ends, a conductive wire 42 electrically connects the electrode 7, 8 to its corresponding crystal facet 9a, 9b via the conductive coating on its corresponding base element 11, 12. When a potential difference is applied to the electrodes, the conductive wires 42 reside at both ends on the field-averted sides of the electrodes 7, 8. As an alternative or in addition, the electrical connection between at least one of the electrodes 7, 8 and the corresponding base element can also be established by using an electrically conductive elastic adhesive 32 and/or an electrically conductive elastic o-ring 31. The additional layer of electrical conductivity 41a on the base elements 11, 12 enables electrical contacting of the facets 9a, 9b of the electro-optic crystal 9 without distorting the residual field in close vicinity to the facets 9a, 9b, and provides a large contact area for the reliable electrical connection of the wire 42, o-ring 31, and/or adhesive 32. In addition, the design with the contact areas between the base elements 11, 12 and the facets 9a, 9b being smaller than the facets 9a, 9b of the electro-optic crystal allows to avoid the application of transparent electrically conductive coating onto one or more faces of the base elements and allows for an enlarged area for electrical contacting of the facets of the electro-optic crystal 9. In further embodiments, the conductive wire 42 can also be directly connected to at least one of the facets. In embodiments, the electrically conductive areas of base elements and/or the facets are electrically contacted by more than one conductive wire to increase the reliability of the electrical contact.

The base elements 11, 12 enable mechanical fixation of the electro-optic crystal 9 without exercising excessive mechanical force onto the electro-optic crystal 9 that could introduce stress-induced birefringence via elasto-optic coupling. This is particularly important for DC voltage measurement, since slowly varying, e.g. temperature-induced optical phase shifts caused by stress-induced birefringence cannot be distinguished from electric-field-induced DC electro-optic phase shifts. Furthermore, the means for elastic fixation 31, 32 impart only little stress onto the electro-optic crystal 9, in particular in case of thermal expansion of the gas-tight compartment 1a or of parts of the compartment along the longitudinal direction of the module 1c.

The faces, in particular longitudinal or lateral faces, of the electro-optic crystal 9, that are exposed to a voltage drop when a voltage is applied to the mounted module 1c, are advantageously partially or completely coated with a layer 41b of moderate electrical conductivity. Preferably, such longitudinal faces are in electrical contact with the electrically conductive layers 10 at the facets 9a, 9b of the electro-optic crystal, in particular such that a moderately conductive path is formed between the two facets 9a, 9b. The electrical conductivity of the layer 41b is chosen to be higher than the conductivity of the electro-optic crystal 9 and lower than the electrical conductivity of the electrically conductive layer 10 at the facets 9a, 9b of the electro-optic crystal 9. In particular, under DC voltage conditions the moderate electrical conductivity is large enough to be able to discharge the electro-optic crystal 9 or to avoid build-up of space charges in the electro-optic crystal 9, and is small enough not to lead to a leakage current that results in significant thermal heating of the electro-optic crystal 9 in particular so that the crystal temperature does not exceed the temperature of the surrounding gas by more than e.g. 1° C. when a voltage, in particular a nominal voltage or a maximum rated overvoltage of the optical voltage sensor, is applied. As a result, this layer 41b contributes to a stable electrical field distribution without weakening the dielectric strength of the gas-tight compartment 1a.

An arrangement of optical elements is attached to the base elements 11, 12 (mostly not shown in FIGS. 1-3). The arrangements of optical elements attached to each base element 11, 12 are chosen according to the used optical interrogation scheme to retrieve the electro-optic phase shift in the electro-optic crystal 9. Different interrogation schemes are e.g. listed in Refs. [1], [2], [12], and [11]. The arrangement of optical elements can comprise Faraday rotators, collimating lenses, graded index lenses, phase retarders, mirrors, retroreflectors, beamsplitters, polarizers, polarizing beam splitters, or optical fibers. An optical fiber is typically tethered to the base element 11 or 12 via a fiber ferrule 51.

The module 1c is connected by one more optical fibers 50, preferably arranged in a fiber-optic cable, which are guided to the outside of the gas-tight compartment 1a, and are connected with further parts of the optical voltage sensor, e.g. an opto-electronics box, comprising e.g. a (fiber-coupled) light source, one or more (fiber-coupled) light detectors, electronics for controlling the light source and for amplifying and digitizing the detector current or voltage, a signal processing unit for calculation of the voltage signal from the detector signal(s) and for communication, as well as further optical elements depending on the optical interrogation scheme of electro-optic phase shift. This optoelectronics unit can be mounted directly on the outside of the gas compartment 1a or can reside in a remote location. The fibers used can be multimode or singlemode optical fibers or polarization maintaining singlemode fibers. In the embodiment shown in FIG. 1, an optical fiber 50 is connected to the ground potential end of the module 1c. In further embodiments, optical fibers can also be connected to the high-voltage end of the module 1c or to both ends. As an alternative, the photodetectors and/or light source are arranged inside the gas-tight compartment 1a, e.g. as parts of the module 1c. In this case, electrical connections are guided to the outside of the gas-tight compartment 1a and connected to the opto-electronics box.

The optical voltage sensor operates on the principle of the Pockels effect or electro-optic effect: the applied electric field induces a corresponding change in the birefringence of the electro-optic crystal 9 which is detected as a differential phase shift between two light waves with orthogonal polarizations propagating through the crystal, preferably along the field lines. The crystal class of the electro-optic crystal and its crystal orientation with respect to the light path are chosen so that the electro-optic phase shift is proportional to a line integral of the electric field along the light path through the electro-optic crystal 9. With the applied voltage V dropping fully between the facets 9a, 9b, the electro-optic phase shift $\Delta\varphi$ becomes $$\Delta\varphi = \frac{2\pi n^3 r}{\lambda} \int E \cdot ds = \frac{2\pi n^3 r}{\lambda} V,$$

wherein $\lambda$ is the wavelength of the probe light or its wave-length average and n is the relevant refractive index of the electro-optic crystal 9 and r is the relevant electro-optic coefficient (in other words: $n^3 r$ is to be calculated for the given crystal class and crystal orientation with respect to light direction and electric field direction and is typically a combination of electro-optic tensor elements and refractive indices of the crystal). An exemplary proper corresponding choice is a BGO (Bismuth germanate, $Bi_4Ge_3O_{12}$) crystal with its [001] direction parallel to the light path. Further possible choices are listed in Ref. [8]. In preferred embodiments, the longitudinal axis of the electro-optic crystal 9, normal to the facets 9a, 9b, is parallel to the path of the probe light. As a result of the line integration, the sensor correctly measures an applied DC voltage, even in the presence of induced currents and build-up of space charges in the crystal 9. In other geometries or crystal classes, particularly if the field is applied transverse to the optical path, such space charges would result in signal drift and instability.

In further preferred embodiments, the gas-tight compartment 1a is filled with gas, an insulation gas or fluid, a dielectric insulation medium, $SF_6$, $N_2$, $CO_2$, or a gas mixture. Especially, surface parts of the electro-optic crystal 9 that are exposed to a potential drop, e.g. the side faces of a cylinder shaped crystal 9, are in direct contact to the gas in the gas-tight compartment 1a or to the entire gas volume of the gas-tight compartment 1a, when the module 1c is mounted in the gas-tight compartment 1a and a potential difference is applied to electrodes 7, 8. Herein, in particular direct contact explicitly permits coatings 41b, 41c applied to the surfaces of the electro-optic crystal; however there is no sub-compartment surrounding or containing the electro-optic crystal 9. Such a sub-compartment is used in prior art and is formed as an insulating tube or as an insulator having a bore and surrounding the crystal, in particular over its entire length; the tube is typically equipped with a filter cartridge to prevent direct gas exchange between an outer gas compartment and the sub-compartment. In case of an applied DC voltage, such a sub-compartment would be prone to the build-up of space charges and accompanying electric field enhancements with risk of dielectric breakdown.

The electro-optic crystal 9 is preferably coated by a passivating layer 41c. The passivating layer or coating 41c protects the crystal 9 against deterioration, e.g. from chemical reactions with components within the gas-tight compartment 1a that can be created from decomposition of the insulation gas or the dielectric insulation medium by electrical arcing inside the compartment and/or by diffusion into the compartment a. For example, hydrofluoric acid can be formed from water diffused into the compartment 1a and from decomposition products of $SF_6$. Such a coating 41c can e.g. be formed by a layer of polyvinylidene fluoride (PVDF) which is known for its chemical resistance. In further embodiments, the gas-tight compartment 1a contains, in addition or as an alternative, material to absorb moisture and/or decomposition products of the insulation gas.

As an alternative, the gas-tight compartment 1a is evacuated.

The module 1c is designed so that it can be mounted or is mountable in the gas-tight compartment 1a. In other words, the gas-tight compartment 1a has means for mounting. The mounting or the ability for mounting of the module in the gas-tight compartment explicitly includes embodiments wherein parts of the module, in particular its electrodes, form walls of the gas-tight compartment. Furthermore, it is a feature of the invention that the gas-tight compartment 1a is gas-tight after mounting of module 1c. Preferably, the two electrodes 7, 8 of the module 1c are held at and are electrically connected to corresponding outer electrodes 4, 5 that are part of the gas-tight compartment 1a and are shaped to fit the corresponding electrodes 7, 8 of the module 1c. In preferred embodiments, the module 1c is a plug-in module to be plugged in in the gas-tight compartment 1a. The plug-in mechanism can comprise a mechanical, reversible fastening device to fixate at least one of the electrodes 7, 8 to the corresponding outer electrode 4, 5. The mechanical, reversible fastening device can e.g. comprise screws, a snap-fit mechanism, a coupling nut, an externally threaded electrode and an internally threaded outer electrode, a bayonet joint, or a retaining spring.

It is further preferred that, when the module 1c is mounted in the gas-compartment 1a and a potential difference is applied to the electrodes 7, 8, any elements of the gas-tight compartment 1a bridging the potential of the electrodes 7, 8, such as the insulating walls 3, are in a distance to the electro-optic crystal 9 exceeding the length of the electro-optic crystal 9 so that space charges e.g. building up in the insulating walls 3 have only a small impact on the field distribution inside the compartment 1a and along the crystal 9 and do not affect the dielectric strength of the compartment 1a. In particular, the shape of outer high voltage electrode 4 at high voltage and its distance to compartment parts on ground potential are chosen such that the field strength stays below critical limits for dielectric breakdown and partial discharge and the sensor is able to pass high voltage tests according to industry standards. This includes that the inner walls of the gas-tight compartment 1a, the module 1c, and all further objects, especially metallic objects, inside the compartment have preferably proper smooth and rounded corners and edges to minimize peak electric fields strengths and reduce the risk of partial discharge.

In embodiments, a distance, in particular a lateral distance, between the electro-optic crystal 9 and insulating elements or walls of the gas-tight compartment 1a, in particular an insulating tube, bridging the potentials of the two electrodes 7, 8, when the module is mounted in the gas-compartment and a potential difference is applied to the electrodes, exceeds a lateral extension of the outer high voltage electrode 4.

Several features of the disclosed invention are in particular suited for measurement of direct current (DC) voltages. Nevertheless, the invention can also be used for measurements of alternating current (AC) voltages or of a combined AC and DC voltages, e.g. an AC voltage with DC offset. The disclosed invention is especially suited for measurement of voltages over 50 kV.

In another embodiment of the disclosed invention, at least one of the base elements 11, 12 can be alternatively of a non-transparent material, e.g. a metal plate with an aperture for the arrangement of optical elements attached to the base plate. In embodiments, in case of a reflective sensor configuration, a reflector 13 can be embodied by a reflective layer between the base element 11 and the crystal facet 9a and a non-transparent base element 11 may be chosen. If the reflective layer is conductive, it can also replace the transparent and conductive layer 10. Also, the base elements 11, 12 can consist of several sub base elements of the same or of different material, attached to the corresponding crystal facet and/or attached to each other. Base plates or sub-base plates from an electrically conductive material such as metal do not require that the electrically conductive layer 41a used for coating of base plates 11, 12 is made from a material that is not electrically conductive.

Chipping of the electro-optic crystal 9 and components can result in unwanted changes of the electrical field distribution. Therefore, as a general feature, preferably, materials of high fracture toughness are chosen. As the electro-optic crystal 9 is mainly chosen according to its electro-optical properties, this requirement is particularly important for the further components. Especially, base elements 11, 12 are preferred with a fracture toughness higher than the electro-optical crystal 9. This condition is e.g. fulfilled by BK7 glass in case of an electro-optic crystal of BGO.

As a further general feature of the invention, the base elements 11, 12 are preferably chosen to be of a material of similar thermal expansion as the electro-optic crystal 9. Since thermal expansion coefficients between different materials can differ by several orders of magnitude, preferred ranges for the thermal expansion coefficients of the base element 11 and/or 12 are specified as [50%, 200%] or [20%, 500%] of the thermal expansion coefficient of the electro-optic crystal 9. The thermal expansion coefficient e.g. of BK7 glass lies within both ranges in case of an electro-optic crystal 9 made of BGO.

In case of transparent base elements 11, 12, these base elements are, as a further general feature of the invention, prepared such that they have negligible linear birefringence for reasons given further above. Birefringence resulting from the manufacturing process of the base elements 11, 12 can be removed by thermal annealing. Furthermore, the parts may be chosen to be of material of a low elasto-optic coefficient. Mechanical stress induced in the base elements 11, 12 e.g. by any means of fixation results via elasto-optic coupling in a birefringence of the base elements 11, 12, which can distort the voltage measurement, in particular of DC voltage. To this end, the material of the transparent base elements 11, 12 is chosen in a preferred embodiment so that its elasto-optic coefficient is smaller than the elasto-optic coefficient of the electro-optic crystal 9. In case of an electro-optic crystal 9 of BGO, this condition is e.g. fulfilled by transparent base elements 11, 12 made from flint glass which shows an extremely low elasto-optic coupling.

The transparent layer of high electrical conductivity 10 at the facets of the electro-optic crystal 9 can, depending on the wavelength of probe light or interrogation, e.g. consist of a film of aluminum-doped zinc oxide, tin-doped indium oxide, indium-doped cadmium oxide, indium-doped zinc oxide, gallium-doped zinc oxide, or ultrathin metal films. If the optical voltage sensor is operated in reflection, the coating 10 of the facet 9a at the reflective end can be a reflective, conductive film, in particular a metal film.

In preferred embodiments, the geometry (dimensions and shapes) of the assembly 1a, 1c can be optimized, in particular by means of computer-based finite-element analysis of the electrical field distribution, so that the field strength stays below critical values for dielectric breakdown and partial discharge.

In case of AC voltages the field distribution is determined by the electrode shapes as well as the shape and permittivity of dielectric materials exposed to the field, whereas in case of DC voltages the conductivity of the dielectric components in the assembly 1a, 1c can also strongly affect the field distribution. The conductivity of dielectric materials is typically very low but varies significantly, and can show a significant temperature dependence which has to be considered in the design of the gas-tight compartment 1a in order to achieve good electrical field distribution and low risk of dielectric breakdown and partial discharge over the entire operational temperature range, e.g. from −40° C. to 85° C.

The disclosed invention is not restricted to a given optical interrogation scheme of the electro-optic phase shift induced by the voltage applied to the electrodes 7, 8, but can be adapted to a number of different interrogation schemes. A reflective sensor configuration is disclosed here. The invention is however not limited to reflective configurations and can also be adapted to transmission schemes where the probe light passes the electro-optic crystal only once. In this case, optical fibers are preferably tethered to both base elements 11, 12.

In further preferred embodiments, the gas-tight compartment 1a is also tight under pressures of up to 20 bar.

The layers 10, 41b, 41c coated to the electro-optical crystal 9 are understood to be part of the electro-optical crystal 9, because their very thin dimension and their fabrication as a coating on the crystal does not allow their usage or integration into the module 1c without the electro-optic crystal 9. In particular, they are not viewed as elements bridging or dielectrically bridging the potentials of the two electrodes 7, 8 or elements mechanically connecting both electrodes 7, 8.

The module 1c is mechanically robust, which means in particular that it is robust enough to be self-supporting and thus stable under its own weight, in particular with only end-sided fixations.

A transparent coating is understood to show a light transmission larger than 50% in an operational wavelength range of the sensor. A reflective coating is understood to show a reflectivity larger than 50% in this wavelength range. An operational wavelength range is a range that contains at least one wavelength emitted by the utilized light source for which all optical components in the optical path work according to their designed operational principle.

The assembly of gas-tight compartment 1a together with the module 1c can be part of a gas-insulated switchgear, or it can be attachable to a gas-insulated switchgear, in other words the assembly 1a, 1c has means for being attached to a gas-insulated switchgear. The gas in gas-tight compartment 1a is preferably separated from the gas in further compartments of the gas-insulated switchgear such that gas decomposition products generated, in particular by switching operation, in those compartments do not penetrate into the gas-tight compartment 1a. This design simplifies replacement of the gas-tight compartment 1a at the gas-insulated switchgear. In preferred embodiments, walls of other compartments of the gas-insulated switchgear can share walls with the gas-tight compartment 1a, in particular such that the gas-tight compartment 1a is only gas-tight after being attached to the gas-insulated switchgear or after being attached to the gas-insulated switchgear and after mounting of the module 1c. Said gas-insulated switchgear can especially be a DC gas-insulated switchgear. In preferred embodiments, at least parts of the gas-tight compartment 1a are exposed at its outside to ambient air.

For the purposes of this disclosure a gas or fluid filled into the gas-tight compartment 1a can be any dielectric insulation medium, may it be gaseous and/or liquid, and in particular can be a dielectric insulation gas or arc quenching gas. Such dielectric insulation medium can for example encompass media comprising an organofluorine compound, such organofluorine compound being selected from the group consisting of: a fluoroether, an oxirane, a fluoroamine, a fluoroketone, a fluoroolefin, a fluoronitrile, and mixtures and/or decomposition products thereof. Herein, the terms "fluoroether", "oxirane", "fluoroamine", "fluoroketone", "fluoroolefin", and "fluoronitrile" refer to at least partially fluorinated compounds. In particular, the term "fluoroether" encompasses both fluoropolyethers (e.g. galden) and fluoromonoethers as well as both hydrofluoroethers and perfluoroethers, the term "oxirane" encompasses both hydrofluorooxiranes and perfluorooxiranes, the term "fluoroamine" encompasses both hydrofluoroamines and perfluoroamines, the term "fluoroketone" encompasses both hydrofluoroketones and perfluoroketones, the term "fluoroolefin" encompasses both hydrofluoroolefins and perfluoroolefins, and the term "fluoronitrile" encompasses both hydrofluoronitriles and perfluoronitriles. It can thereby be preferred that the fluoroether, the oxirane, the fluoroamine, the fluoroketone and the fluoronitrile are fully fluorinated, i.e. perfluorinated.

In embodiments, the dielectric insulation medium or more specifically the organofluorine compound comprised in the dielectric insulation medium or gas is selected from the group consisting of: fluoroethers, in particular a or several hydrofluoromonoether(s); fluoroketones, in particular a or several perfluoroketone(s); fluoroolefins, in particular a or several hydrofluoroolefin(s); fluoronitriles, in particular a or several perfluoronitrile(s); and mixtures thereof.

In particular, the term "fluoroketone" as used in the context of the present invention shall be interpreted broadly and shall encompass both fluoromonoketones and fluorodiketones or generally fluoropolyketones. Explicity, more than a single carbonyl group flanked by carbon atoms may be present in the molecule. The term shall also encompass both saturated compounds and unsaturated compounds including double and/or triple bonds between carbon atoms. The at least partially fluorinated alkyl chain of the fluoroketones can be linear or branched and can optionally form a ring.

In embodiments, the dielectric insulation medium comprises at least one compound being a fluoroketone, which may optionally comprise also heteroatoms incorporated into the carbon backbone of the molecules, such as at least one of: a nitrogen atom, oxygen atom and sulphur atom, replacing a corresponding number of carbon atoms. More preferably, the fluoromonoketone, in particular perfluoroketone, can have from 3 to 15 or from 4 to 12 carbon atoms and particularly from 5 to 9 carbon atoms. Most preferably, it may comprise exactly 5 carbon atoms and/or exactly 6 carbon atoms and/or exactly 7 carbon atoms and/or exactly 8 carbon atoms.

In embodiments, the dielectric insulation medium comprises at least one compound being a hydrofluoroether selected from the group consisting of: hydrofluoro monoether containing at least three carbon atoms; hydrofluoro monoether containing exactly three or exactly four carbon atoms; hydrofluoro monoether having a ratio of number of fluorine atoms to total number of fluorine and hydrogen atoms of at least 5:8; hydrofluoro monoether having a ratio of number of fluorine atoms to number of carbon atoms ranging from 1.5:1 to 2:1; pentafluoro-ethyl-methyl ether; 2,2,2-trifluoroethyl-trifluoromethyl ether; and mixtures thereof.

In embodiments, the dielectric insulation medium comprises at least one compound being a fluoroolefin selected from the group consisting of: hydrofluoroolefins (HFO) comprising at least three carbon atoms, hydrofluoroolefins (HFO) comprising exactly three carbon atoms, 1,1,1,2-tetrafluoropropene (HFO-1234yf; also named 2,3,3,3-tetrafluoro-1-propene), 1,2,3,3-tetrafluoro-2-propene (HFO-1234yc), 1,1,3,3-tetrafluoro-2-propene (HFO-1234zc), 1,1,1,3-tetrafluoro-2-propene (HFO-1234ze), 1,1,2,3-tetrafluoro-2-propene (HFO-1234ye), 1,1,1,2,3-pentafluoropropene (HFO-1225ye), 1,1,2,3,3-pentafluoropropene (HFO-1225yc), 1,1,1,3,3-pentafluoropropene (HFO-1225zc), (Z)1,1,1,3-tetrafluoropropene (HFO-1234zeZ; also named cis-1,3,3,3-tetrafluoro-1-propene), (Z)1,1,2,3-tetrafluoro-2-propene (HFO-1234yeZ), (E)1,1,1,3-tetrafluoropropene (HFO-1234zeE; also named trans-1,3,3,3-tetrafluoro-1-propene), (E)1,1,2,3-tetrafluoro-2-propene (HFO-1234yeE), (Z)1,1,1,2,3-pentafluoropropene (HFO-1225yeZ; also named cis-1,2,3,3,3 pentafluoroprop-1-ene), (E)1,1,1,2,3-pentafluoropropene (HFO-1225yeE; also named trans-1,2,3,3,3 pentafluoroprop-1-ene), and mixtures thereof.

In embodiments, the organofluorine compound can also be a fluoronitrile, in particular a perfluoronitrile. In particular, the organofluorine compound can be a fluoronitrile, specifically a perfluoronitrile, containing two carbon atoms, and/or three carbon atoms, and/or four carbon atoms. More particularly, the fluoronitrile can be a perfluoroalkylnitrile, specifically perfluoroacetonitrile, perfluoropropionitrile ($C_2F_5CN$) and/or perfluorobutyronitrile ($C_3F_7CN$). Most particularly, the fluoronitrile can be perfluoroisobutyronitrile (according to the formula $(CF_3)_2CFCN$) and/or perfluoro-2-methoxypropanenitrile (according to formula $CF_3CF(OCF_3)CN$). Of these, perfluoroisobutyronitrile is particularly preferred due to its low toxicity.

The dielectric insulation medium can further comprise a background or carrier gas different from the organofluorine compound (in particular different from the fluoroether, the oxirane, the fluoroamine, the fluoroketone, the fluoroolefin and the fluoronitrile) and can in embodiments be selected from the group consisting of: air, $N_2$, $O_2$, $CO_2$, a noble gas, $H_2$; $NO_2$, NO, $N_2O$; fluorocarbons and in particular perfluorocarbons, such as $CF_4$; $CF_3I$, $SF_6$; and mixtures thereof.

A further aspect of the disclosed invention consists in a method of assembling the disclosed assembly 1a, 1c. This method inter alia comprises steps of adding electrically conductive layers 10 to the facets or end faces 9a, 9b of the electro-optic crystal 9 and layers of moderate electrical conductivity 41b to the side faces of the electro-optic crystal 9. Subsequently, a passivating layer 41c can be applied to the crystal 9, in particular along the side faces. In further steps, optical arrangements are attached to the base elements 11, 12, which are subsequently adhered to the electro-optical crystal 9. In a further subsequent step, the module 1c is mounted in the gas-tight compartment 1a. Subsequently, the gas-tight compartment 1a is filled with gas or is evacuated.

REFERENCES

[1] U.S. Pat. No. 6,016,053.
[2] DE 196 04 908 A1.
[3] WO 2009/080109 A1.
[4] U.S. Pat. No. 5,136,236.
[5] EP 1 710 589 (A1).
[6] K. Kurosawa et al., "Development of an optical instrument transformer for DC voltage measurement," IEEE Transactions on Power Delivery, vol. 8, pp. 1721-1726, 1993.
[7] F. Cecelja et al., "Validation of electro-optic sensors for measurement of DC fields in the presence of space charge," Measurement, vol. 40, pp. 450-458, 2007.
[8] U.S. Pat. No. 5,715,058.
[9] WO 00/34793.
[10] Chavez et al., IEEE Transactions on Power Delivery 17, 362 (2002).
[11] WO 2011/154408 A1.
[12] WO 2008/077255 A1
[13] EP 1 462 810 A1
[14] EP 0 907 084 B1.

REFERENCE SYMBOLS

1a: gas-tight compartment
1b: metallic wall of gas compartment at ground potential
1c: module, plug-in module
2: dead-end conductor 3: insulating wall of gas compartment
4: outer electrode at high voltage potential, shielding cover
5: outer electrode at ground potential, metallic annular flange
6: metallic top flange
7: electrode at high voltage potential
8: electrode at ground potential
9: electro-optic crystal
9a: facet at high voltage potential, end face
9b: facet at low voltage potential, end face
10: film, layer of high electrical conductivity, transparent film, layer of high electrical conductivity
11: base element at high voltage potential
12: base element at low voltage potential
13: reflector
20: insulation gas
31: o-ring
32: elastic adhesive
41a: layer of high electrical conductivity
41b: layer of moderate electrical conductivity
41c: passivating layer
42: conductive wire
50: optical fiber
51: ferrule and/or collimator
52: fiber feedthrough

The invention claimed is:

1. An assembly, comprising an optical voltage sensor and a gas-tight compartment,
the optical voltage sensor comprising a module, with the module comprising first and second electrodes, for applying a potential difference defining the voltage to be measured, and an electro-optic crystal having a first facet electrically connected to the first electrode and a second facet electrically connected to the second electrode, with the gas-tight compartment and the module designed so that the module is mounted in the gas-tight compartment,
wherein the electro-optic crystal is the only element of the module that mechanically connects the two electrodes and bridges the potentials of the two electrodes with the first and second facet of the electro-optic crystal being coated, partially or completely, with electrically conductive layers that are transparent at both facets, or are transparent at one facet and reflective at the other facet,
wherein surface parts of the electro-optic crystal exposed to a voltage potential drop when a voltage is applied to the module are coated partially or completely with a layer having a moderate electrical conductivity, which is larger than the conductivity of the electro-optic crystal and is smaller than the conductivity of the electrically conductive layers at the first and second facets.

2. The assembly of claim 1, wherein the module does not comprise an insulating tube or an insulator with a bore, which surrounds the electro-optic crystal.

3. The assembly of claim 1, wherein the gas-tight compartment does not comprise an insulating tube or an insulator with a bore, which bridges the potentials of the two electrodes and surrounds the electro-optic crystal along its full length, when the module is mounted in the gas-tight compartment and a potential difference is applied to the electrodes.

4. The assembly of claim 1, wherein the gas-tight compartment comprises a first outer electrode, shaped to fit the first electrode of the module, and a second outer electrode, shaped to fit the second electrode of the module.

5. The assembly of claim 4, wherein at least one electrode of the module is connectable to the corresponding outer electrode, the module being a plug-in module.

6. The assembly of claim 4, wherein the first outer electrode is electrically connected to a conductor guided into the gas-tight compartment through an insulating wall.

7. The assembly of claim 4, wherein the second outer electrode is electrically connected with conducting walls of the gas-tight compartment.

8. The assembly of claim 1, wherein any portion of the gas-tight compartment bridging the potential of the electrodes are in a distance to the electro-optic crystal exceeding the length of the electro-optic crystal, when the module is mounted in the gas-tight compartment and a potential difference is applied to the electrodes.

9. The assembly of claim 1, wherein the module has a longitudinal axis, a lateral extension of each of the first and second electrodes of the module exceeding the extension of the first and second facets corresponding thereto at least by a factor of two.

10. The assembly of claim 1, wherein portions of the gas-tight compartment are exposed at its outside to ambient air.

11. The assembly of claim 1, wherein probe light propagates along a light path at least once through the electro-optic crystal from one of the first and second facets to the other of the first and second facets, and the crystal class of the electro-optic crystal and its crystal orientation with respect to the light path are chosen so that an electro-optical phase shift is proportional to a line integral of the electric field along the light path through the electro-optic crystal.

12. The assembly of claim 1, with at least one base element being attached to at least one of the facets.

13. The assembly of claim 12, with at least one of the at least one base element being of a material of lower elasto-optic coefficient than the electro-optic crystal.

14. The assembly of claim 13, with the at least one of the at least one base element being of a material of lower elasto-optic coefficient than the electro-optic crystal.

15. The assembly of claim 13, with the at least one of the at least one base element being of BK7 glass, flint glass, or fused silica.

16. The assembly of claim 13, with at least one of the at least one base element having surfaces that are partially or completely coated with conductive layers that are in electrical contact with the first or second facet corresponding thereto.

17. The assembly of claim 12, with the at least one base element having a higher fracture toughness than the electro-optic crystal and/or having a thermal expansion coefficient within a percentage range of [50%, 200%] of the thermal expansion coefficient of the electro-optic crystal.

18. The assembly of claim 12, with at least one optical arrangement attached to the at least one base element, the optical arrangement comprising at least one optical element selected from the group consisting of: a Faraday rotator, a collimating lens, a graded index lens, a phase retarder, a mirror, a retroreflector, a beamsplitter, a polarizer, a polarizing beam splitter, an optical fiber, or combinations thereof.

19. The assembly of claim 12, with an elastic fixation between the at least one base element and the electrode that is electrically connected with the first or second facet corresponding thereto, with the elastic fixation comprising at least one element selected from the group consisting of: o-ring, conductive o-ring, elastic adhesive, conductive elastic adhesive, silicone adhesive, mechanical spring, and combinations thereof.

20. The assembly of claim 12, with a contact area between the electro-optic crystal and the at least one base element being smaller than the area of the first or second facet corresponding thereto of the electro-optic crystal.

21. The assembly of claim 12, wherein an electrically conductive path is formed between at least one of the electrodes and the corresponding first or second facet via a conductive wire, conductive adhesive, or a conductive o-ring connecting the at least one electrode with a base element that is in electrical contact with the corresponding facet, wherein the conductive wire, the conductive adhesive, or the conductive o-ring reside(s) on the field-averted side of the electrode, when the module is mounted within the gas-tight compartment and a potential difference is applied to the electrodes.

22. The assembly of claim 1, for measuring a direct current (DC) voltage, a high direct current (DC) voltage, an alternating current (AC) voltage, a high alternating current (AC) voltage, voltages larger than 50 kV, or a combination thereof.

23. The assembly of claim 1, being incorporated into or attached to a gas-insulated switchgear.

24. The assembly of claim 1, with the gas-tight compartment being filled with gas, an insulation gas, a dielectric insulation medium, $SF_6$, $N_2$, $CO_2$, or a gas mixture.

25. The assembly of claim 24, with the surface parts of the electro-optic crystal exposed to the voltage potential drop when the module is mounted in the gas-tight compartment and the voltage is applied to the first and second electrodes, being in direct contact with the medium or gas inside the gas-tight compartment.

26. The assembly of claim 24, with the surface of the electro-optic crystal being partially or completely coated with a passivating layer.

27. The assembly of claim 1, wherein the gas-tight compartment is evacuated.

28. A gas-insulated switchgear comprising the assembly of claim 1, wherein the gas-insulated switchgear is a direct current gas-insulated switchgear.

* * * * *